United States Patent [19]
Back

[11] Patent Number: 5,153,528
[45] Date of Patent: Oct. 6, 1992

[54] GAIN CONTROL TYPE AMPLIFYING APPARATUS

[75] Inventor: Dong-cherl Back, Suwon, Rep. of Korea

[73] Assignee: SamSung Electronics, Suwon, Rep. of Korea

[21] Appl. No.: 730,006

[22] Filed: Jul. 15, 1991

[30] Foreign Application Priority Data
   Jan. 30, 1991 [KR] Rep. of Korea .............. 1585/1991

[51] Int. Cl.⁵ .................. H03G 3/30; H03F 3/45
[52] U.S. Cl. .................. 330/254; 330/261; 330/279
[58] Field of Search .......... 330/69, 129, 254, 261, 330/279

[56] References Cited
U.S. PATENT DOCUMENTS
4,818,051 3/1982 Harwood et al. ................ 330/254

Primary Examiner—James B. Mullins
Attorney, Agent, or Firm—Robert E. Bushnell

[57] ABSTRACT

Disclosed is a gain control type amplifying apparatus for controlling a gain of an input signal and an amplifying DC voltage level. The apparatus includes an input line for receiving an input signal, a differential amplifying circuit of which one input terminal is connected to receive the input signal, a first active resistor for controlling the amount of current of the current path of the differential amplifying circuit, a voltage divider including a second active resistor connected to the other input terminal of the differential amplifying circuit, an instruction input circuit for converting gain control and bias control instructions designated by a user into digital gain control and bias voltage control signals, a first digital to analogue converter for controlling the resistance value of the first active resistor, and converting the digital gain control signal of the instruction input circuit into an analogue one, and a second analogue to digital converter for controlling the resistance value of the second active resistor, and converting the digital bias voltage control signal of the instruction input circuit into an analog one and an output line for outputting an output signal of the differential amplifying circuit.

14 Claims, 1 Drawing Sheet

GAIN CONTROL TYPE AMPLIFYING APPARATUS

BACKGROUND OF THE INVENTION

The present invention relates to a gain control type amplifying apparatus, and more particularly to a gain control type amplifying apparatus which can precisely control an alternating current gain and a direct current level.

Generally, amplifying apparatuses is used for amplifying input signals, are classified into two types, that is, a constant gain type amplifying apparatus for amplifying an input signal at a given amplifying rate and a gain control type amplifying apparatus for freely varying the amplifying rate of the input signal.

In a conventional gain control type amplifier, a gain of the amplifier is controlled according to a resistance value of a variable resistance varied by the a user, which has a problem that the gain is not precisely controlled. Also, since a bias voltage of the conventional gain control type amplifier is fixed to a constant voltage, there is an additional problem that input signals less than the bias voltage are not amplified and are intercepted therein.

The above problems will be described below with reference to the attached drawing. FIG. 1 is a circuit diagram of a conventional gain control type amplifier. In FIG. 1, first and second transistors Q1 and Q2 are amplification a voltage divider composed of two resistors R3 and R4 and three diodes D1 to D3 connected in series between supply power $V^{cc}$ and ground GND, supplies a bias voltage to the base of second transistor Q2. A third transistor Q3 serves as an active resistance which controls the quantity of current on the current path of first and second transistors Q1 and Q2. Resistor R5 and variable resistor VR1 connected in series between supply power $V^{cc}$ and ground GND supply a control voltage for controlling the gain to the base of third transistor Q3.

As described above, the conventional gain control type amplifier has a disadvantage that input signals less than a bias voltage are intercepted because the bias voltage is fixed to a constant voltage and the gain control can not be also controlled precisely because a variable resistor in which its resistance value is variable by users, is used.

SUMMARY OF THE INVENTION

Therefore, it is an object of the present invention to provide a gain control type amplifying apparatus for controlling bias levels adaptively according to the direct current level of input signals, and precisely controlling the gain of input signals.

To accomplish the object, the gain control type amplifying apparatus according to the present invention comprises:

an input line for inputting an input signal;

differential amplifier of which one input terminal of two input terminals is connected to the input line;

a first active resistor for controlling the current quantity of the current path of the differential amplifier;

voltage divider including a second active resistor connected to the other input terminal of the differential amplifier;

instruction inputter for converting a gain control instruction and bias control instruction designated by a user to a digital gain control signal and a digital bias control signal, respectively;

first digital to analog converter for converting the digital gain control signal of the instruction input device into analog signal, and controlling the resistance value of the first active resistor;

second digital to analog converter for converting the digital bias control signal of the instruction input device into analog signal, and controlling the resistance value of the second active resistor; and an output line for outputting an output signal of the differential amplifying device

BRIEF DESCRIPTION OF THE DRAWINGS

These and other advantages of the present invention will be more apparent by describing a preferred embodiment of the present invention with reference to the attached drawings, in which.

DETAILED DESCRIPTION OF THE INVENTION

Now, the present invention will be described below in detail with reference to FIG. 2.

Figure 1:
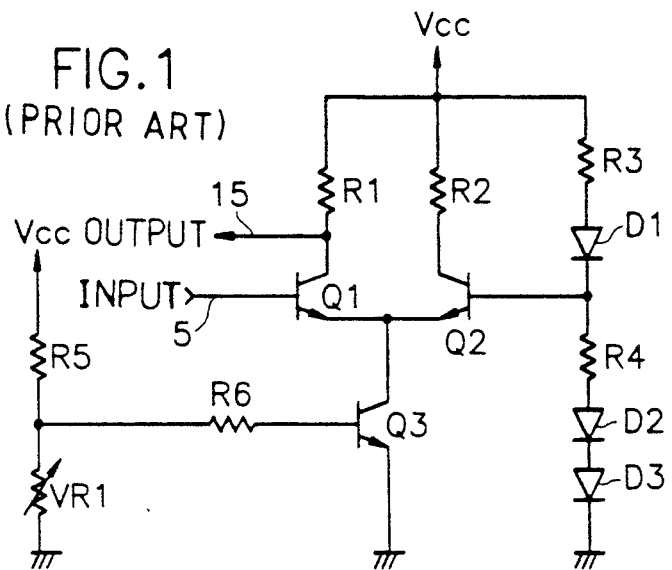
FIG. 1 is a circuit diagram of a conventional gain control type amplifying apparatus.
Figure 2:
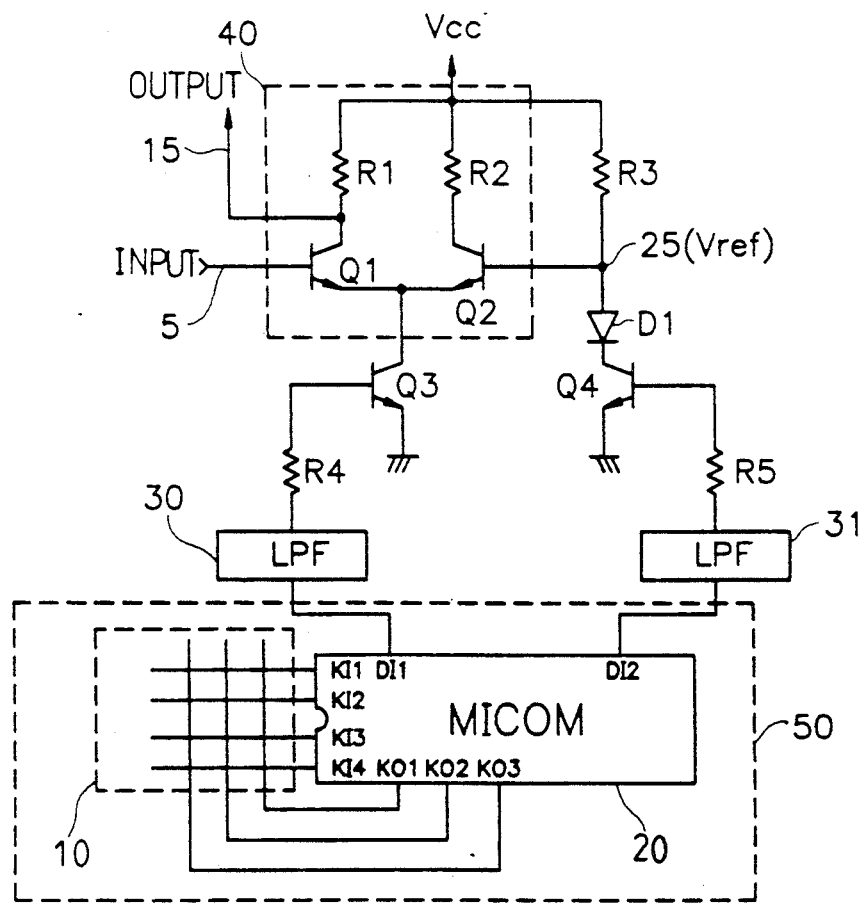
FIG. 2 is a circuit diagram showing one embodiment of a gain control type amplifying apparatus according to the present invention.

Referring to FIG. 2, input line 5 is coupled between an analog signal source, (not shown) to receive an analog input signal, and the base of a first transistor Q1. The collector of first transistor Q1 is coupled to a first supply power $V^{cc}$ through a resistor R1. The collector of a second transistor Q2 is coupled to the supply power $V^{cc}$ through a resistor R2. The collector of a third transistor Q3 is coupled commonly to both the emitters of first and second transistors Q1 and Q2. The emitter of third transistor Q3 is coupled to a second supply power GND. A resistor R3 is coupled between first supply power $V^{cc}$ and the base of second transistor Q2. The anode of a diode D1 is coupled to the base of second transistor Q2. The cathode of diode D1 is coupled to the collector of a fourth transistor Q4. The emitter of fourth transistor Q4 is coupled to ground GND. Key matrix 10 is coupled to key scan ports KI1 to KI4, and KO1 to KO3 of micro computer 20 (hereinafter referred to as micom). A first and second output terminals DI1 and DI2 of micom 20 are coupled to the respective input terminals of a first low pass filter 30 (hereinafter referred to as LPF) and a second LPF 31. The output terminal of first LPF 30 is coupled to the base of third transistor Q3 through a resistor R4. The output terminal of second LPF 31 is coupled to the base of fourth transistor Q4 through a resistor R5. The dotted line part 40 including two resistors R1 and R2 and two transistors Q1 and Q2 corresponds to differential amplifying means and the dotted line part 50 including key matrix 10 and micom 20 to instruction input means. Also, the above-mentioned first and second LPF 30 and 31 are digital to analogue converting means which converts the digital signal which is output from the instruction input device into an analogue signal.

In the operation of the apparatus shown in FIG. 2, differential amplifier 40 amplifies the difference voltage between the voltage of the input signal on input line 5 and the divided voltage Vref on a connecting point 25 at an amplifying rate determined by the resistance value of third transistor Q3 functioning as an active resistor and then, supplies the amplified difference voltage to an output line 15. More detailed description of the operation is as follows.

First transistor Q1 increases or decreases the quantity of the current flowing through load resistor R1 according to the voltage difference between input line 5 and the collector of third transistor Q3. Then, second transistor Q2 controls the quantity of the current flowing through resistor R2 according to the voltage difference between divided voltage Vref on connecting point 25 and the voltage on the collector of third transistor Q3. Thus, the currents flow through load resistor R1 and load resistor R2 in response to the resistance value of the third transistor Q3 functioning as an active resistors and the divided voltage on connecting point 25 remains constant, increasing or decreasing contrary to each other according to the voltage level of the input signal on input line 5. In other words, when the voltage level of the input signal is larger than the divided voltage on connecting point 25, the current value of load resistor R1 becomes large and the current value of resistor R2 becomes small. Reversely, when the voltage level of the input signal is smaller than the divided voltage on connecting point 25, the current value of load resistor R1 becomes small and the current value of resistor R2 becomes large. As result, the divided voltage on connecting point 25 limits the direct current level width capable of amplifying the input signal on input line 5.

Resistor R3, diode D1 and fourth transistor Q4 serving as voltage divider and being connected in series between the power supply $V^{cc}$ and ground GND. divide the differenced voltage between the power supply $V^{cc}$ and ground GND with a voltage dividing ratio of the resistance values of resistor R3 and fourth transistor Q4 functioning as the active resistor, and supply divided voltage Vref to the base of second transistor Q2 through connecting point 25.

The resistance values of third transistor Q3 and fourth transistor Q4 functioning as active resistors decrease as the voltage values applied to the bases of third and fourth transistors Q3 and Q4 respectively increase.

Key matrix 10 including a plurality of numeral keys and a gain control mode designating key and a bias mode designating key transmits the gain control quantity and bias voltage control quantity designated by a user for the respective modes into micom 20.

Micom 20 performs a pulse width modulation (hereinafter referred to as PWM) of the gain control quantity and bias voltage control quantity input from key matrix 10 and then, generate PWM modulated gain control signal and a bias voltage control signal. The PWM signal which is a kind of digital signal, has a variable pulse width.

First LPF 30 integrates the PWM gain control signal generated from micom 20 and supplies the gain control signal having a DC voltage to the base of third transistor Q3 through resistor R4. At this time, third transistor Q3 controls the gain of differential amplifier 40 by maintaining the resistance value corresponding to the voltage level of the gain control signal applied from first LPF 30 to the base of third transistor Q3 through resistor R4.

Second LPF 31 integrates the PWM bias voltage control signal generated from micom 20 and supplies the bias voltage control signal having a DC voltage to the base of fourth transistor Q4 through resistor R5. Then, fourth transistor Q4 controls divided voltage Vref on connecting point 25, functioning as a bias voltage of the differential amplifier 40, by maintaining the resistance value corresponding to the voltage level of the bias voltage control signal applied from second LPF 31 to the base of fourth transistor Q4 through resistor R5.

As described above in detail, the present invention advantageously prevents distortion of an input signal having a small voltage level by properly controlling a voltage of one input terminal not used as an input terminal for the differential amplifier in accordance with the input signal being input to the other input terminal of the differential amplifier. An output signal having a gain desired by a user, can be obtained by adjusting the gain with a digital signal.

What claimed is:

1. A gain control type amplifying apparatus, comprising:
    differential amplifying means having a first input terminal receiving an input signal, a second input terminal, and an output terminal;
    a first active resistor for controlling a first current through said differential amplifying means;
    voltage dividing means connected to said second input terminal of said differential amplifying means, for regulating a voltage at said second input terminal; and
    control means for receiving a gain control input signal and a bias control input signal, and generating a digital gain control signal and a digital bias control signal;
    wherein a resistance of said first active resistor is regulated in response to said digital gain control signal.

2. The gain control type amplifying apparatus, as claimed in claim 1, wherein said digital gain control signal and said digital bias control signal are pulse width modulated signals.

3. The gain control type amplifying apparatus, as claimed in claim 2, further comprising a digital to analog means, said digital to analog converting means comprises two integrators for integrating said digital gain control signal and said digital bias control signal.

4. A gain control type amplifying apparatus comprising:
    differential amplifying means having a first input terminal receiving an input signal, a second input terminal, and an output terminal;
    a first active resistor for controlling a first current through said differential amplifying means;
    voltage dividing means comprising a second active resistor, said voltage dividing means for regulating a voltage at said second input terminal of said differential amplifying means; and
    control means for receiving a gain control input signal and bias control input signal and for generating a digital gain control signal and a digital bias control signal;
    wherein a resistance of said second active resistor is regulated in response to said digital bias control signal of said control means.

5. The gain control type amplifying apparatus as claimed in claim 4, wherein said digital gain control signal and said digital bias control signal are pulse width modulated signals.

6. The gain control type amplifying apparatus, as claimed in claim 5, further comprising first digital to analog converting means for converting said digital gain control signals to an analog gain signal received by said first active resistor and second digital to analog converting means for converting said digital bias control signal to an analog bias signal received by said second active resistor.

7. The gain control type amplifying apparatus, as claimed in claim 6, wherein each of said first digital to analog converting means and said second digital to analog converting means comprises an integrator.

8. An amplifier circuit, comprising:
   differential amplifier means having a first input terminal for receiving an input signal, a second input terminal for receiving a reference voltage signal, and an output terminal;
   voltage dividing means for generating said reference voltage signal;
   control means for generating a gain control signal for regulating a gain of said differential amplifier means and a bias control signal for regulating a voltage dividing ratio of said voltage dividing means; and
   first transistor means for regulating a first current through said differential amplifier means in response to said gain control signal.

9. The amplifier circuit, as claimed in claim 8, wherein said gain control signal and said bias control signal are pulse width modulated signals.

10. The amplifier circuit, as claimed in claim 9, said voltage dividing means comprises second transistor means.

11. The amplifier circuit, as claimed in claim 10, wherein said control means comprises:
    a first low-pass filter for low-pass filtering said gain control signal; and
    a second low-pass filter for low-pass filtering said bias control signal.

12. The amplifier circuit, as claimed in claim 8, wherein said differential amplifier means is a differential amplifier comprising a first bi-polar junction transistor and a second bi-polar junction transistor each receiving different corresponding one of said input signal and said reference voltage signal at a base, respectively.

13. The amplifier circuit, as claimed in claim 8, wherein said voltage dividing means compries:
    a first resistor connected between a supply voltage terminal and said second input terminal; and
    a series connected diode and first transistor connected between said second input terminal and a ground terminal, said transistors for regulating said reference voltage signal in response to said bias control signal.

14. The amplifier circuit, as claimed in claim 13, wherein said control means comprises;
    a first low-pass filter for low-pass filtering said gain control signal received by said first transistors means; and
    a second low-pass filter for low-pass filtering said bias control signal received by said transistor.

* * * * *

UNITED STATES PATENT AND TRADEMARK OFFICE
CERTIFICATE OF CORRECTION

PATENT NO. : 5,153,528
DATED : 6 October 1992
INVENTOR(S) : Dong-cherl Back

It is certified that error appears in the above-identified patent and that said Letters Patent is hereby corrected as shown below:

Claim 3, Column 4, Line 40, insert --converting-- after "log".

Signed and Sealed this

Twenty-eighth Day of September, 1993

Attest:

BRUCE LEHMAN

*Attesting Officer*     *Commissioner of Patents and Trademarks*